United States Patent [19]

Fisch

[11] 4,314,022

[45] Feb. 2, 1982

[54] PHOTORESIST DEVELOPERS AND PROCESS

[75] Inventor: Richard S. Fisch, St. Paul, Minn.

[73] Assignee: Minnesota Mining and Manufacturing Company, St. Paul, Minn.

[21] Appl. No.: 146,642

[22] Filed: May 5, 1980

[51] Int. Cl.³ .............................................. G03C 5/00
[52] U.S. Cl. .................................... 430/326; 430/275; 430/276; 430/278; 430/331; 430/526; 252/79.5
[58] Field of Search ............... 430/331, 275, 276, 278, 430/326, 526; 252/79.5

[56] References Cited

U.S. PATENT DOCUMENTS

| | | | |
|---|---|---|---|
| 3,475,171 | 10/1969 | Alles | 430/331 |
| 3,957,583 | 5/1976 | Smith | 252/79.5 |
| 4,008,084 | 2/1977 | Ikeda et al. | 430/276 |
| 4,078,102 | 3/1978 | Bendz et al. | 252/79.5 X |
| 4,094,679 | 6/1978 | Washizawa et al. | 430/331 X |
| 4,193,797 | 3/1980 | Cohen | 430/260 X |

Primary Examiner—Mayer Weinblatt
Attorney, Agent, or Firm—Cruzan Alexander; Donald M. Sell; Mark A. Litman

[57] ABSTRACT

A developing solution for use with imaging film comprising a photoresist layer over an aluminum coated substrate and the process of developing the film are shown to be rapid acting. The developing solution comprises an aqueous solution having a pH of at least 12.5 of an alkali metal hydroxide and a chelating agent having a stability constant for $Al^{+3}$ of at least 6.70.

10 Claims, No Drawings

PHOTORESIST DEVELOPERS AND PROCESS

TECHNICAL FIELD

Amongst the many types of imaging systems available, one that has been receiving increasing attention is that comprising a photoresist layer over a metal coating on a substrate. The photoresist layer is imaged, creating areas in the layer with differential solubility properties. The more soluble areas of the layer are washed off, exposing the metal coating layer beneath it. The metal coating is then etched in the exposed areas, providing an image corresponding to the original imaging exposure.

This type of imaging system provides very stable metal images since the image is formed of metal film. This lends and is also useful in numerous imaging systems such as those employed as graphic arts film. Lithographic plates may be made from these images because they have good resolution and can form excellent halftone reproductions.

BACKGROUND ART

Photoresist materials on metallic substrates having either positive acting or negative acting photoresist layers are well known in the art. U.S. Pat. Nos. 3,395,016; 3,639,185; 3,469,982; 3,782,939; and 4,193,797 as well as Canadian Pat. Nos. 976,352 and 976,353 disclose various imaging materials of this type.

Some of these patents disclose aluminum or aluminum coated substrates as the image density layer, but aluminum has been a particularly difficult material to use in such imaging systems. As noted in U.S. Pat. No. 4,008,084, aluminum is recognized as being quite difficult to etch owing to its tendency to form aluminum oxide which is not readily attacked. U.S. Pat. No. 4,008,084 attempts to solve the problem by mixing particles of iron in the aluminum to provide a more readily etchable material.

Other references attempt to avoid using aluminum at all, providing a metal coating layer of molybdenum, bismuth, chromium, or tellurium instead. These metals have their own problems associated with them, including cost, limited quantities available, and/or toxicity.

Furthermore, when using these systems of the prior art, it has usually been necessary to use one solution to remove the photoresist, an intermediate wash bath, a second solution to etch the metal layer, and then a final wash bath.

DISCLOSURE OF THE INVENTION

The present invention has enabled the use of imaging materials comprising a photoresist layer over an aluminum containing coating on a substrate. It has been found that by the use of developing solutions according to the present invention, such aluminum containing photoresist elements may be developed rapidly in one both to produce images of good resolution. The developer is also very effective as an etchant or developer for systems with other metals such as tin, zinc, bismuth, tellurium, molybdenum, iron, etc.

The developer solutions of the present invention are aqueous alkaline solutions having a pH of from 12.5 to 14.0 comprising an alkali metal hydroxide and a chelating agent having a stability constant for aluminum ion ($Al^{+3}$) greater or equal to 6.70.

The preferred alkali metal hydroxides are potassium and sodium hydroxide, but lithium, calcium and magnesium hydroxide, etc., may also be used alone or in combination with the other metal hydroxides.

The pH of the solution is preferably between 12.9 and 13.7 and most preferably between 13.1 and 13.4.

The stability constant for aluminum ion must be greater or equal to 6.70. There appears to be a sharp break in the ability of the chelating agent to function as required in the present invention according to its stability constant. Known chelating agents with stability constants for aluminum ion just below 6.7 do not work and chelating agents with slightly higher constants do work. There does not appear to be any direct correlation between improved function in the present invention and higher stability constant. Materials with stability constants higher than 7.00, 7.25 and even 16.00 are also useful. The concentration of the chelating agents should be at least 0.015 M, preferably 0.02 M and most preferably at least 0.05 M. The upper limit is determined solely by the solubility of the agent. Concentrations up to 1.0 M and 1.5 M have been used, but without commensurately increased improvement as compared to solutions with lower concentrations.

Other useful addenda may also be included in the solutions of the present invention which improve the performance of the solutions. Oxidizing agents may be included, for example. These materials, such as chlorides, chlorates, hypochlorites, perchlorates, bromides, bromates, nitrates, sulfates, etc., tend to increase the rate of etching. Surfactants, which tend to reduce the contact angle between the developing solutions and the aluminum, are useful in that the induction period for etching of the aluminum tends to be reduced and enable uniform densities to be formed across the film because of uniform contact or wetting of the solution to the film. Buffering agents for high pH solutions or materials, such as carbonates, which tend to produce a common salt effect in keeping aerial carbon dioxide from dissolving in the solution and reducing the pH, are also useful. These materials are not required to be present in the practice of the present invention, but when used are preferably in concentrations of from 0.001 M to 0.10 M, preferably from 0.005 M to 0.06 M for the surfactant, up to 0.4 M (from a minimum of 0.001 M) for the oxidizing agent, and up to 0.5 M (from a minimum of 0.001 M) for the carbonate or common salt material for carbon dioxide.

The photoresist imaging elements useful with the developers of the present invention comprise any element having a substrate with an aluminum containing coating thereon and a photoresist layer over the coating. The photoresist coating may be either a positive or a negative photoresist, becoming either more soluble or less soluble (respectively) to an aqueous alkaline solution when struck by light. As shown in the prior art discussed above, these types of compositions are well known in the art. The preferred compositions are those of the type disclosed in U.S. Pat. No. 4,247,616. The term aluminum containing coating is defined as any layer containing metallic aluminum, which includes layers of only aluminum, layers of aluminum and other metals having a lower ionization potential than aluminum as disclosed in U.S. Pat. No. 4,008,084, or other combinations of aluminum and etchable materials. Layers in which the aluminum or other metal are oxidized, which to some degree cannot be prevented, are also included in the term.

The substrate on which the aluminum containing coating is deposited, as by vapor coating, pyrolysis of salts, or sputtering, may be substantially any substrate. Polymeric substrates such as polyethyleneterephthalate are preferred, but ceramic substrates, glass, paper, and non-etchable metals may also be used. The polymeric substrates may be transparent, translucent or opaque (as by inclusion of white opaque pigments), depending upon the ultimate use of the film. Other polymeric materials such as acrylic and methacrylic resins, epoxy resins, polycarbonates, polyvinyl chloride, polyvinyl butyral, polyvinyl acetate, polyamides, polyolefins, etc., whether primed or not, as known in the art, may also be used.

The process of using the developers of the present invention comprises exposing to light an article comprising a substrate having an aluminum containing coating and over said coating a photosensitive layer which becomes differentially soluble to aqueous alkaline solutions in light exposed and light unexposed areas, and then agitating the exposed photosensitive layer with the developer solution of the present invention to both remove the more soluble areas of the photosensitive layer, to expose the aluminum containing layer, and to etch the aluminum coating layer. The film may then be washed, e.g., in water, to remove the developer solution.

Where the photosensitive layer becomes less soluble in aqueous alkaline solution where light struck (as by light initiated polymerization), the layer is a negative acting photoresist material. Where the photosensitive layer becomes more soluble in aqueous alkaline solution where light struck (as by formation of more soluble species by light initiated decomposition), the layer is a positive acting photoresist material.

The aluminum containing layer may be treated to improve the bonding of the photoresist layer to its surface. This can be affected by conventional prior art techniques such as chemical or mechanical abrading.

These and other aspects of the present invention will be shown in the following examples.

EXAMPLE 1

A basic bath solution consisting of 0.6 M sodium hydroxide and 0.2 M sodium carbonate was prepared. To selected 10 ml aliquots of this bath were added 0.20 grams of the following chemicals listed in Table 1. The volume of the aliquots were raised to 20 ml with additional amounts of the bath solution and the solution pH adjusted with sodium hydroxide to 13.3 and maintained at 38° C.

A pre-exposed sample of a positive acting photoresist taken from Example 1 of U.S. Pat. No. 4,247,616, was coated at 3 microns on a 400° A. vapor coated polyester layer. This was cut into discrete 16 mm sample sizes, and each sample was immersed in an aliquot of the bath solution. At 30 second intervals after immersion, the samples were lifted out of solution and shaken in the solution as a form of agitation. Table 1 records the time needed to fully remove the exposed resist and the exposed vapor coated aluminum layer from the polyester base. Also recorded in Table 1 are the stability constants of the chemical additives. Similar data were obtained using potassium hydroxide.

Table 1 data indicate that compounds with a stability constant higher than 6.7 produce a decrease in development time.

EXAMPLE 2

Three baths consisting of 0.3 M sodium hydroxide and 1 M sodium carbonate were formulated. One of these baths additionally contained 0.2 M sulfosalicylic acid, one other bath 0.02 M sulfosalicylic acid, and the third, no sulfosalicylic acid. These baths were heated and maintained at 25° C. Pre-exposed samples of the positive acting photoresist of Example 1 coated onto a 400° A. aluminum vapor coated layer on a $1.016 \times 10^{-2}$ cm polyester base was cut into discrete test samples. As in Example 1 each sample was immersed into one of these baths and agitated at 30 second intervals.

The following table records the time needed to completely remove the exposed photoresist and also the vapor coated aluminum layer from the polyester base.

TABLE 2

| Amount of Chelate | Time required at 25° C. |
|---|---|
| 0 | 7¼ min. |
| 0.02M | 6 min. |
| 0.2M | 4¼ min. |

EXAMPLE 3

A photopolymer layer (a negative acting photoresist composition comprising 12 parts by weight of 1,3-bis(3-[2,2,2-(triacryloyloxymethyl)ethoxy-2-hydroxypropyl)-5,5-dimethyl-2,4-imidazolidinedione [produced according to U.S. Pat. No. 4,249,011], 1.6 parts of a polyallylisophthalate prepolymer [Dapon ®35], 3.2 parts of an 86/14 poly(vinyl acetate/vinyl chloride) copolymer, 0.4 parts of an 80/20 poly(butylmethacrylic acid/methyl acrylic acid) copolymer, 0.7 parts Michler's ketone, 1.4 parts diphenyliodonium tetrafluoroborate, and acetone to 300 parts by weight) was coated onto a 400° A. aluminum vapor coated polyester web that had been lightly abraded so that the polymer would adhere. This abrasion treatment provided wet anchorage of the photopolymer layer to the aluminum vapor coated substrate. Unexposed samples of this material were cut into appropriate sizes and used as the film samples of this example.

Four developer solutions were made containing 0.3 M sodium hydroxide, 0.1 M sodium carbonate and 5% sulfonated dodecyldiphenyl ether as a surfactant. Solutions A additionally contained 0.1 M ethylenediaminetetraacetic acid as the sole chelating agent. Solution B contained 0.1 M diaminopropanoltetraacetic acid as the sole chelating agent. Solution C contained 0.1 M nitrilotriacetic acid as the sole chelating agent. Solution D contained no chelating agent. All of these solutions were adjusted with sodium hydroxide to a pH of 13.5 and a temperature of 25° C. Solutions A, B and C all had faster development rates than did solution D.

EXAMPLE 4

This example used the same equipment and test techniques as in Example 3. It also used a basic stock developer containing 0.3 M sodium hydroxide, 0.1 M sodium carbonate and 5% sulfonated dodecyldiphenyl ether. Solution A additionally contained 0.1 M ethylenediaminetetraacetic acid. Solution B additionally contained 0.1 M diaminopropanoltetraacetic acid. Solution C additionally contained 0.1 M nitrilotriacetic acid. Solution D contained no chelating agent. All of these solutions were adjusted to a pH of 13.5.

Film test samples were prepared by coating the negative acting photopolymer solution of Example 3 onto an aluminum vapor coated layer (about 400° A. and having a transmission optical density of 3.0) on a $1.016 \times 10^{-2}$ cm polyester base. Unexposed samples of this material were cut into a discrete size and used as test film. Film handling procedures and the test procedures used were identical to Example 3. To reach a minimum optical density of 0.1, it took approximately 45 seconds for solution C, 60 seconds for B, 65 seconds for A and 90 seconds for D.

TABLE 1

| CHEMICAL ADDITION | DEVELOPMENT TIME | STABILITY CONSTANT* |
|---|---|---|
| No Addition | 5 min | 0 |
| Pyruvic Acid | 4 min 40 sec | 1.05 |
| Arginine | 4 min 10 sec | 6.67 |
| Oxalic Acid | 2 min 5 sec | 7.26 |
| Nitrilotriacetic Acid | 2 min 30 sec | +10 |
| Salicylic Acid | 3 min 3 sec | 14.1 |
| Sulfosalicylic Acid | 1 min 50 sec | 13.2 |
| Ethylenediaminetetraacetic Acid | 2 min 50 sec | 16.11 |

*"Stability Constants" Special Publication #17 London Chemical Society, London England 1964.

EXAMPLE 5

Solution C of Example 3 (at a pH of 13.3) was used to evaluate the effect of the addition of oxidizing agents to the developer solutions. This solution developed the positive acting photoresist construction of Example 1 in 4 minutes.

To a portion of solution C was added 0.01 M $Na_2ClO_2$ and the pH readjusted to 13.3 with sodium hydroxide. Development under the same conditions required only 3 minutes. The presence of the oxidizing agent clearly accelerated the development.

What is claimed is:

1. A process for forming an image on a photosensitive element comprising (1) a substrate, (2) a metal containing layer on said substrate, and (3) a photoresist layer on said aluminum containing layer, which photoresist layer becomes differentially soluble in aqueous alkaline solution in light struck versus non-light struck areas, said process comprising exposing said element to light of sufficient intensity to cause light struck and non-light struck areas of said photoresist to become differentially soluble in aqueous alkaline solution and then developing said element by agitating the element in contact with a developing solution comprising an aqueous alkaline solution having a pH of from 12.5 to 13.7 containing an alkali metal hydroxide and a chelating agent for aluminum ion having a stability constant of greater than 6.7.

2. The process of claim 1 wherein the alkali metal hydroxide comprises sodium hydroxide or potassium hydroxide.

3. The process of claim 1 wherein said chelating agent has a stability constant for aluminum ion greater than 7.0.

4. The process of claim 3 wherein the substrate comprises a material selected from the group consisting of polymers, ceramics, glass and paper, the pH of the solution is between 12.9 and 13.7, the chelating agent has a stability constant for aluminum ion greater than 7.0 and is present in a concentration of at least 0.02 M, and the solution additionally contains an oxidizing agent in a concentration of from 0.001 to 0.4 M and carbonate ion in a concentration of from 0.001 to 0.5 M.

5. The process of claim 4 wherein said developer solution dissolves the photoresist in the light struck areas more rapidly than it dissolves the photoresist in the non-light struck areas.

6. The process of claim 4 wherein said developer solution dissolves the photoresist in the non-light struck areas more rapidly than it dissolves the photoresist in the light struck areas.

7. The process of claim 1 wherein said solution has a pH between 12.9 and 13.7 and the chelating agent has a stability constant for aluminum ion greater than 7.0 and is present in a concentration of at least 0.02 M.

8. The process of claim 7 wherein said solution has a pH between 13.1 and 13.4.

9. The process of claim 7 wherein said developer solution dissolves the photoresist in the light struck areas more rapidly than it dissolves the photoresist in the non-light struck areas.

10. The process of claim 7 wherein said developer solution dissolves the photoresist in the non-light struck areas more rapidly than it dissolves the photoresist in the light struck areas.

* * * * *